(12) United States Patent
Ruppert

(10) Patent No.: US 11,659,698 B2
(45) Date of Patent: May 23, 2023

(54) MOLDED POWER MODULE WITH INTEGRATED EXCITER CIRCUIT

(71) Applicant: AUDI AG, Ingolstadt (DE)

(72) Inventor: Daniel Ruppert, Lenting (DE)

(73) Assignee: AUDI AG, Ingolstadt (DE)

( * ) Notice: Subject to any disclaimer, the term of this patent is extended or adjusted under 35 U.S.C. 154(b) by 0 days.

(21) Appl. No.: 17/031,673

(22) Filed: Sep. 24, 2020

(65) Prior Publication Data

US 2021/0092882 A1 Mar. 25, 2021

(30) Foreign Application Priority Data

Sep. 25, 2019 (DE) .......................... 102019125733.6

(51) Int. Cl.
*H05K 7/20* (2006.01)
*H05K 7/14* (2006.01)
(Continued)

(52) U.S. Cl.
CPC ......... *H05K 7/20927* (2013.01); *H01L 23/31* (2013.01); *H01L 23/36* (2013.01);
(Continued)

(58) Field of Classification Search
CPC ............. H05K 7/20945; H05K 7/1432; H05K 7/20218; H05K 7/2089; H05K 7/20872; H05K 7/20927; H05K 7/20254; H05K 7/209; H01L 23/31; H01L 23/36; H01L 23/473; H01L 23/3677; H02M 1/32; H02M 1/327; H01H 9/52
See application file for complete search history.

(56) References Cited

U.S. PATENT DOCUMENTS 6,529,394 B1 * 3/2003 Joseph .................. H02M 7/003
361/689
6,972,972 B2 * 12/2005 Duncan ................. H02M 7/003
363/131
(Continued)

FOREIGN PATENT DOCUMENTS

DE  10 2014 114 122 A1  4/2015
DE  10 2015 219 476 A1  12/2016
(Continued)

OTHER PUBLICATIONS

English Translation of DE-102017117120-A1 (Year: 2018).*
(Continued)

*Primary Examiner* — Zachary Pape
*Assistant Examiner* — Amir A Jalali
(74) *Attorney, Agent, or Firm* — Seed IP Law Group LLP

(57) ABSTRACT

A power module for electric drives is provided which comprises at least one exciter circuit with at least one power semiconductor, wherein the power module is molded and the exciter circuit with the at least one power semiconductor is integrated in the molded power module. A traction inverter is also provided which comprises a water-cooled main cooler, wherein the main cooler comprises a bearing surface which is configured to receive power modules, wherein the traction inverter comprises at least one molded power module, and wherein the main cooler forms a cooling connection which is configured to receive the molded power module on the main cooler.

8 Claims, 3 Drawing Sheets

(51) Int. Cl.
*H01L 23/31* (2006.01)
*H01L 23/36* (2006.01)
*H02M 1/32* (2007.01)
*H01L 23/433* (2006.01)
*H01L 23/473* (2006.01)
*H02M 7/00* (2006.01)

(52) U.S. Cl.
CPC ........ *H01L 23/4334* (2013.01); *H01L 23/473* (2013.01); *H02M 1/32* (2013.01); *H05K 7/1432* (2013.01); *H05K 7/209* (2013.01); *H05K 7/20945* (2013.01); *H01L 23/3107* (2013.01); *H02M 1/327* (2021.05); *H02M 7/003* (2013.01); *H05K 7/20254* (2013.01)

(56) References Cited

U.S. PATENT DOCUMENTS

| | | | |
|---|---|---|---|
| 9,570,373 B1* | 2/2017 | Schultz | H01L 23/36 |
| 2003/0179596 A1* | 9/2003 | Joseph | H05K 7/20927 |
| | | | 363/141 |
| 2010/0232131 A1* | 9/2010 | Qian | H01L 23/49575 |
| | | | 361/813 |
| 2011/0188204 A1* | 8/2011 | Horiuchi | H01L 23/473 |
| | | | 361/702 |
| 2012/0014059 A1* | 1/2012 | Zeng | H05K 5/065 |
| | | | 361/730 |
| 2012/0281444 A1* | 11/2012 | Dent | H02J 7/35 |
| | | | 363/56.01 |
| 2013/0258596 A1* | 10/2013 | Sharaf | H05K 7/20927 |
| | | | 361/702 |
| 2018/0034385 A1 | 2/2018 | Huang | |
| 2018/0351449 A1* | 12/2018 | Hattori | H02M 7/19 |
| 2019/0181770 A1* | 6/2019 | Martin | H05K 7/20909 |
| 2019/0335608 A1* | 10/2019 | Song | H05K 7/20854 |
| 2020/0355775 A1* | 11/2020 | Dickey | G01R 35/00 |
| 2020/0357582 A1* | 11/2020 | Askan | H01L 23/053 |
| 2021/0153394 A1* | 5/2021 | Mitic | F28D 15/0233 |

FOREIGN PATENT DOCUMENTS

| | | | | |
|---|---|---|---|---|
| DE | 11 2014 004 930 B4 | | 11/2017 | |
| DE | 10 2017 118 200 A1 | | 2/2018 | |
| DE | 102017117120 A1 | * | 2/2018 | ............. H02K 11/00 |
| DE | 10 2018 205 991 A1 | | 2/2019 | |
| DE | 10 2017 118 913 A1 | | 4/2019 | |
| EP | 2 779 235 A2 | | 9/2014 | |
| RU | 2 123 754 C1 | | 12/1998 | |
| WO | WO-2016199635 A1 | * | 12/2016 | ............. H01L 23/28 |

OTHER PUBLICATIONS

WO-2016199635-A1 English Translation (Year: 2016).*
Fraunhofer Institute for Reliability and Microintegreation IZM, "Process and Product Development-Molding", Nov. 11, 2013, https://web.archive.org/web/20131111192947/https://www.izm.fraunhofer.de/de/abteilungen/system_integrationinterconnectiontechnologies/leistungsangebot/prozess_und_produktentwicklung/molding.html, retrieved Mar. 19, 2021 from Wayback Machine, 4 pages.(with English translation).

* cited by examiner

MOLDED POWER MODULE WITH INTEGRATED EXCITER CIRCUIT

BACKGROUND

Technical Field

Embodiments of the present invention relate to a power module for electric drives and to a traction inverter comprising a power module.

Description of the Related Art

Such power electronics are normally used to drive a 3-phase electric machine for traction drives (EV, HEV of the PHEVs). A special embodiment of the electric machine is the so-called separately excited synchronous machine. In contrast to the permanently excited synchronous machine, this type of machine manages without magnetic materials on a rotor and generates the rotor magnetic field by means of an energized winding in the rotor. This introduces additional degrees of freedom in the control and design of the electric machine, whereby increases in efficiency and performance can be achieved.

According to the current prior art, the current is supplied to a rotor winding via slip ring contacts. Excitation of the rotor winding must be effected by means of an additional power electronic DC/DC converter, which is usually integrated in the main converter or traction inverter. Said DC/DC converter (exciter circuit) generates an adjustable voltage from a high voltage (HV).

A power module and a power converter device, in particular for an electric motor of a hybrid or electric vehicle, is known from DE 10 2018 205 991 A1. The power converter device has a main converter circuit with the power module and a control and/or regulation circuit for controlling and/or regulating the main converter circuit, and a driver circuit, wherein the power module is arranged on a heat sink or heat dissipation plate.

A power semiconductor having a shunt resistor is known from document DE 10 2017 118 913 A1. A power semiconductor module encapsulated in a mold compound comprises a shunt resistor with two sensing connections that is provided for electrical measurement functions.

An inductor electric motor with a converter is known from the document RU 21 23 754 C1. The converter has two modules, a first one of which is designed as an armature circuit and a second one is designed as an exciter circuit.

Power electronics for electric drives are thus known in the prior art.

In general, a field current necessary for energizing an electric machine must be metrologically detected in the circuit for controlling a separately excited synchronous machine. In addition, for reasons of "functional safety," the field current flowing into a rotor of the electric machine and the field current flowing out of the rotor must be metrologically detected.

Until now, exciter circuits with discrete components are realized on conventional printed circuit boards (PCBs).

The components are cooled by free convection in the air at ambient temperature inside the power electronics. Furthermore, the metrological detection of the field currents is realized by a current measurement on a PCB or circuit board.

The conversion of the current measurement can be a shunt measurement or also a Hall-element-based measurement. However, this current measurement means an increased expenditure for circuit board surface, for packaging of integrated circuits and for development. In addition, the current measurement is more susceptible to faults and less robust. A temperature drift of the current measurement (shunt) is also problematic. A discrete structure of the exciter circuit results in varying shunt temperatures and thus in deviations in current measurement.

BRIEF SUMMARY

The object of embodiments of the present invention is therefore to provide a device that allows for improved cooling of an exciter circuit and for improved current measurement.

This object is achieved by a power module having the features described herein and by a traction inverter having the features described herein. Advantageous developments and embodiments are the subject matter of the description and description of the figures.

Embodiments of the invention relate to a power module for electric drives. The power module is designed, in particular, for use in a separately excited synchronous machine.

According to embodiments of the invention, the power module comprises at least one exciter circuit with at least one power semiconductor, wherein the power module is molded and the exciter circuit with the at least one power semiconductor is integrated in the molded power module. Integration of the exciter circuit with the at least one power semiconductor into the molded power module results in considerable advantages when integrated into a traction inverter.

On the one hand, no additional PCB or circuit board is required for the exciter circuit including an exciter module, since the exciter circuit can be integrated into an existing PCB or circuit board. The integration thus reduces a required chip surface for the exciter circuit. Integration of the exciter circuit in the molded power module also offers the advantage that an increase in the performance and lifetime of the exciter circuit can be ensured by the integrated arrangement. The power module thus comprises an integrated current shunt measurement and is designed for use in a separate exciter circuit for synchronous machines.

In a further embodiment, the power module comprises a current sensor system which is integrated in the molded power module. Integration of the current sensor system results in considerable advantages during integration in the traction inverter. By integrating an entire measuring chain of the current measurement into the molded power module, for example, susceptibility to interference of the current sensor system or measuring sensor system is minimized or considerably reduced. Furthermore, embodiments of the present invention offer the advantage that discrete components are no longer needed as a result of the integration of both the exciter circuit and the current sensor system into the molded power module, which leads to a reduction in costs during production. The molded power module thus comprises an integrated current shunt measurement.

In a further embodiment, the current sensor system comprises at least two measuring shunts, at least one filter, an integrator stage, a delta-sigma converter/modulator, at least one galvanic separation and at least one receiver interface for an interface to a microcontroller (μC). This offers the advantage that all components or ingredients required for a shunt-based current measurement are integrated into the molded power module, as a result of which both a need for circuit board surface and also for packaging of integrated circuits and for development can be reduced. The sigmadelta converter is configured to provide a digital output signal and to reduce susceptibility to interference.

In an embodiment, the power module has a contact region which is configured and designed to be able to be placed on a main cooler of a traction inverter. Normally, the contact region is configured as a plane surface formed on an outer surface of the molded power module. Alternatively, the contact region is the outer surface of the molded power module. The direct arrangement of the contact region of the molded power module on the main cooler offers the advantage that a temperature dependence of a current measurement of the current sensor system can be almost eliminated because the connection to the main cooler keeps the measurement shunts at a temperature of a cooling medium that flows through the main cooler. Furthermore, the temperature difference of the measuring shunts is also eliminated because they are kept at the temperature of the cooling medium.

The contact region is thus configured for cooling the power module, wherein the contact region is generally an outermost layer of a direct bonded copper (DBC) substrate. The DBC typically consists of a thin ceramic layer which is copper plated on both sides. The ceramic layer is generally formed from an aluminum oxide or an aluminum nitride. The DBC substrate normally shows an excellent electrical insulation and a very good heat distribution. Typically, the surface of the ceramic layer is copper-plated so that simple semiconductor chips can be subsequently soldered or sintered. The dimension of the contact region is formed corresponding to a size of the DCB, wherein a dimension of the DCB is dependent on an integrated chip.

Typically, the plane outer surface is formed on one side of the molded power module that is formed on the opposite side of the power module which can be connected to a PCB or circuit board. Normally, the molded power module also comprises pins which are configured to establish an electrical connection to an internal interconnection. The pins of the power module can thus be connected to a PCB or to electrical conductors on a PCB.

Normally, the contact region can be connected to the main cooler via a thermal connection, in particular via a heat-conducting paste. The contact region is configured to dissipate or emit heat of the molded power module, in particular of the integrated exciter circuit and of the integrated current sensor system, via the heat-conducting paste. Normally, the contact region is configured to dissipate the heat via the heat-conducting paste to a main cooler. Alternatively, the contact region can be connected to the main cooler via gap pads that can improve heat conduction.

In a further embodiment, the exciter circuit integrated into the power module is arranged in the molded power module in such a way that heat of the exciter circuit can be conducted to the contact region and can be discharged or dissipated via the contact region. Normally, the exciter circuit is arranged in the vicinity of the contact region of the molded power module. Typically, the current sensor system is likewise arranged in the molded power module in such a way that heat of the current sensor system can be conducted to the contact region or can be dissipated via the contact region. Normally, the exciter circuit and the current sensor system are thus arranged in the vicinity of the contact region of the molded power module.

Embodiments of the invention further relate to a traction inverter comprising a water-cooled main cooler, wherein the main cooler comprises a bearing surface which is configured to receive power modules.

According to embodiments of the invention, the traction inverter comprises at least one above-described molded power module, wherein the main cooler forms a cooling connection which is configured to receive the at least one molded power module on the main cooler. The main cooler is generally water-cooled. The main cooler is generally designed as a closed metal cooler which has PinFin structures which can be passed through by a coolant. The traction inverter according to embodiments of the invention offers the advantage that an exciter circuit integrated in the molded power module and a current sensor system integrated in the molded power module can be cooled via the main cooler of the traction inverter.

In a further embodiment, the cooling connection is designed as an extension of the bearing surface of the main cooler and configured to accommodate the at least one molded power module. This offers the advantage that only the bearing surface of the main cooler or an existing circuit board has to be slightly increased in order to accommodate the molded power module. Normally, the molded power module is arranged on a bottom side or on the bearing surface. In the area of conventional power modules which are arranged on the main cooler, the main cooler remains unchanged so that they continue to be cooled directly in the coolant via the PinFin structures. This offers the advantage that a modularized converter architecture is provided that is also suitable for permanently excited synchronous machines.

In an embodiment, the cooling connection is designed as a plane surface and configured to at least partially receive the at least one molded power module. Normally, the extension of the bearing surface of the main cooler has, at least in regions, a plane surface which is configured to accommodate at least the contact region of the molded power module. The cooling connection is generally formed on the bottom side or bearing surface of the main cooler. Normally, the cooling connection is arranged on a same side as the conventionally designed power modules which are arranged on the main cooler. Optionally, the cooling connection is designed as a projection.

In a further embodiment, the cooling connection is configured to absorb or dissipate heat that is released by the at least one molded power module. Normally, the molded power module is connected to the main cooler via a thermal connection. The thermal connection is typically realized via a heat-conducting paste. Optionally, the bearing surface comprises a recess which is configured to receive a screw for screwing the power module to the main cooler. The recess can be round, oval or angular. The cooling connection is embodied as a heat sink, which is configured to deliver the heat supplied to it via the contact region by the molded power module to the main cooler or the cooling medium of the main cooler.

In a further embodiment, the main cooler comprises at least two cooling connections, wherein a first cooling connection is formed at a first end of the bearing surface and a second cooling connection is formed at a second end of the bearing surface which is arranged opposite the first end. The main cooler is thus configured to cool at least one exciter circuit and at least one current sensor system simultaneously.

The above-described traction inverter comprises an integrated current shunt measurement and is designed and configured for use in a separately excited synchronous machine.

BRIEF DESCRIPTION OF THE SEVERAL VIEWS OF THE DRAWINGS

Embodiments of the invention are shown schematically in the drawings and will be described further with reference to the drawings, wherein like components are identified by like reference numbers. The following is shown:

FIG. 1B shows a top view of the power module embodiment shown in FIG. 1a,

DETAILED DESCRIPTION

Figure 1A:
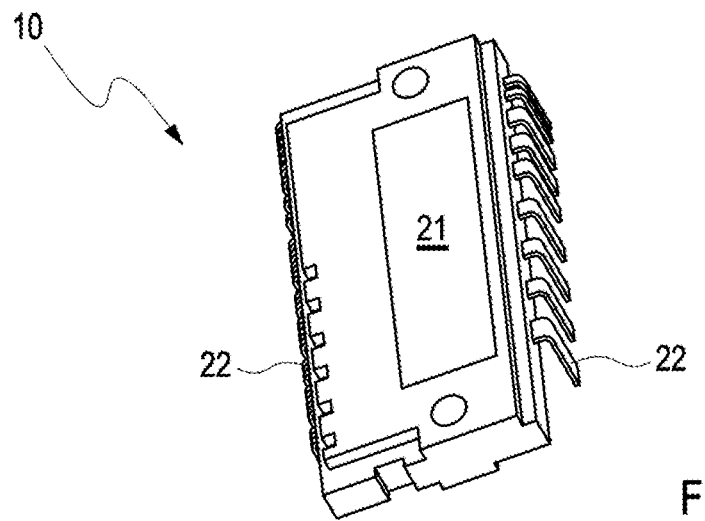
FIG. 1a shows a perspective top view of an embodiment of molded power module.

FIG. 1 shows a perspective top view of an embodiment of an inventive milled power module 10. The molded power module 10 comprises an exciter circuit 30 and a current sensor system 31. The molded power module 10 comprises pins 22 configured to establish an electrical connection to an internal interconnection (not shown). FIG. 1a shows that the power module 10 has a contact region 21 which is configured to be able to be placed on a main cooler (not shown) of a traction inverter.

Figure 1B:
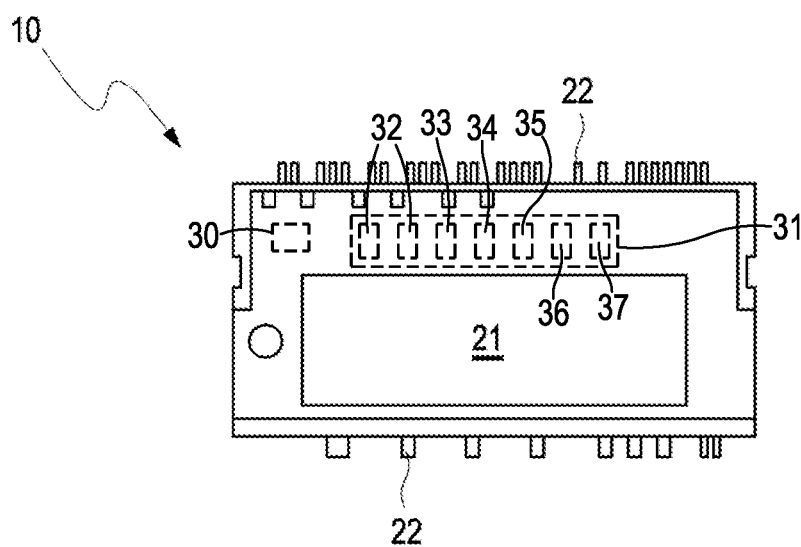

FIG. 1B shows a top view of the embodiment of the power module 10 shown in FIG. 1a. The pins 22 and the contact region 21 are shown. FIG. 1B shows a DC/DC converter (exciter circuit 30) and the current sensor system 31 in dashed lines. The current sensor system 31 includes at least two measuring shunts 32, at least one filter 33, an integrator stage 34, a delta-sigma converter/modulator 35, at least one galvanic separation 36 and at least one receiver interface 37 for an interface to a microcontroller (μC).

Figure 1C:
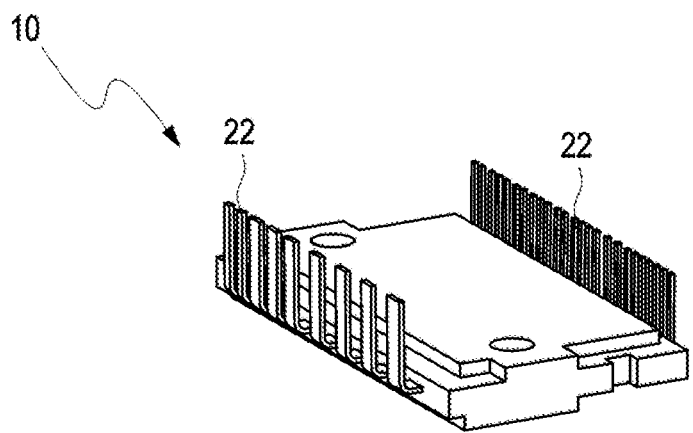
FIG. 1c shows a perspective side view of the power module embodiment shown in FIGS. 1a and 1b.

FIG. 1c shows a perspective side view of the embodiment of the power module 10 shown in FIGS. 1a and 1b. Pins 22 are shown, which are arranged in the direction of a PCB or circuit board (not shown) and pointing to an internal interconnection.

Figure 2:
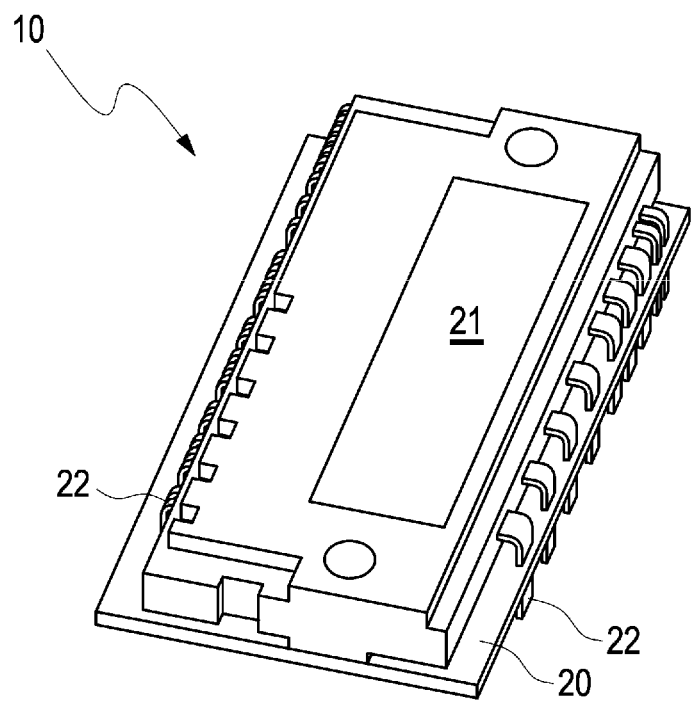
FIG. 2a shows a perspective side view of an embodiment of the power module on a circuit board.
FIG. 2b shows a side view of the power module embodiment shown in FIG. 2a on a main cooler.
Figure 2:
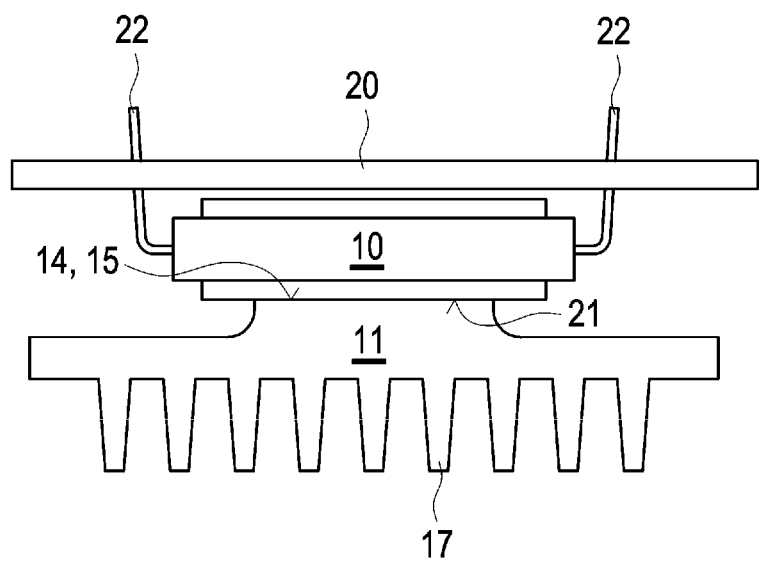

FIG. 2a shows a perspective side view of an embodiment of the power module 10 on a PCB 20 or circuit board. In addition, pins 22 are shown which are embodied such as to point from the power module 10 in the direction of a PCB 20. The pins 22 thereby lead through recesses in the PCB or circuit board 20. The power module 10 comprises the contact region 21 formed on one side of the power module 10 which is formed opposite a side of the power module 10 configured such as to face the PCB 20.

FIG. 2b shows a side view of the embodiment shown in FIG. 2a of the molded power module 10 on a cooling connection 15 of a main cooler 11 which is embodied as a heat sink. The cooling connection is formed on a bearing surface 14 of the main cooler 11. It is shown that the molded power module 10 is arranged above the contact region 21 on the cooling connection 15 of the main cooler 11. Also shown are the PinFin structures 17 of the main cooler 11, around which structures a cooling medium can flow.

Figure 3:
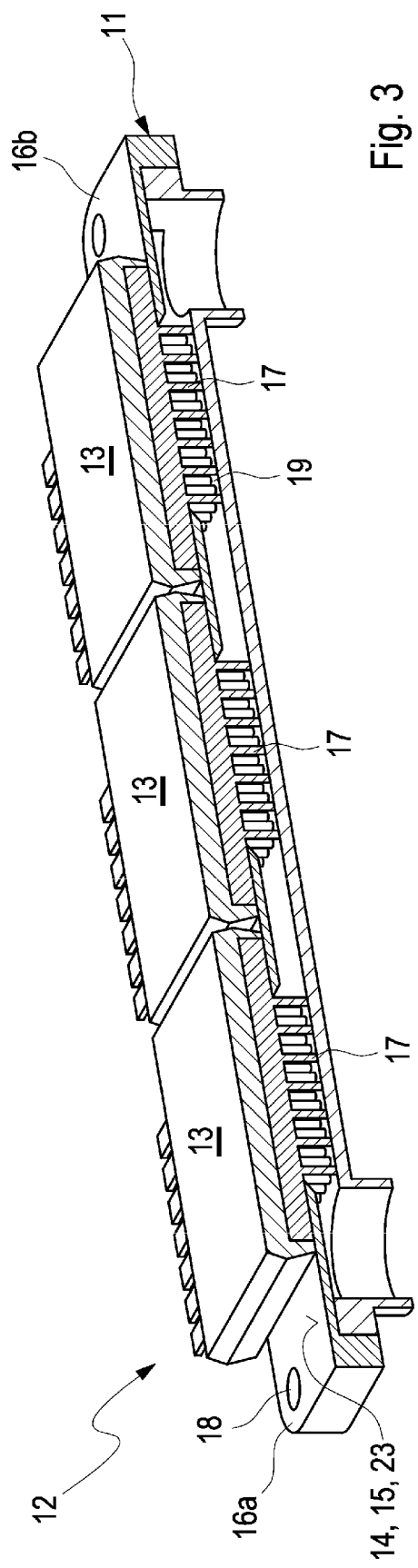
FIG. 3 shows a perspective side view of an embodiment of a traction inverter with a cooling connection formed on a bearing surface of a main cooler.

FIG. 3 shows a perspective side view of an embodiment of a traction inverter 12 having a cooling connection 15 formed on the bearing surface 14 of the main cooler 11. The main cooler 11 is designed as a closed metal cooler and has PinFin structures 17. The main cooler 11 is configured to receive conventional power modules 13 and to heat them via the PinFin structures 17. A cooling medium, in particular water, flows around the PinFin structures 17 in a region 19.

The main cooler 11 has the bearing surface 14 on which the conventional power modules 13 are arranged. The bearing surface 14 has a first end 16a and a second end 16b. The main cooler 11 also has an extension 23 of the bearing surface 14 which in the present embodiment is formed at the first end 16a of the bearing surface 14. The cooling connection 15 is formed on the extension 23 of the bearing surface 14. The extension 23 optionally corresponds to the cooling connection 15.

In the present embodiment, the cooling connection is formed as a plane surface and is configured to receive a molded power module (not shown). The bearing surface 14 comprises a recess 18 configured for receiving a screw and for possibly screwing the power module 13 to the main cooler 11 by means of the screw.

Figure 4:
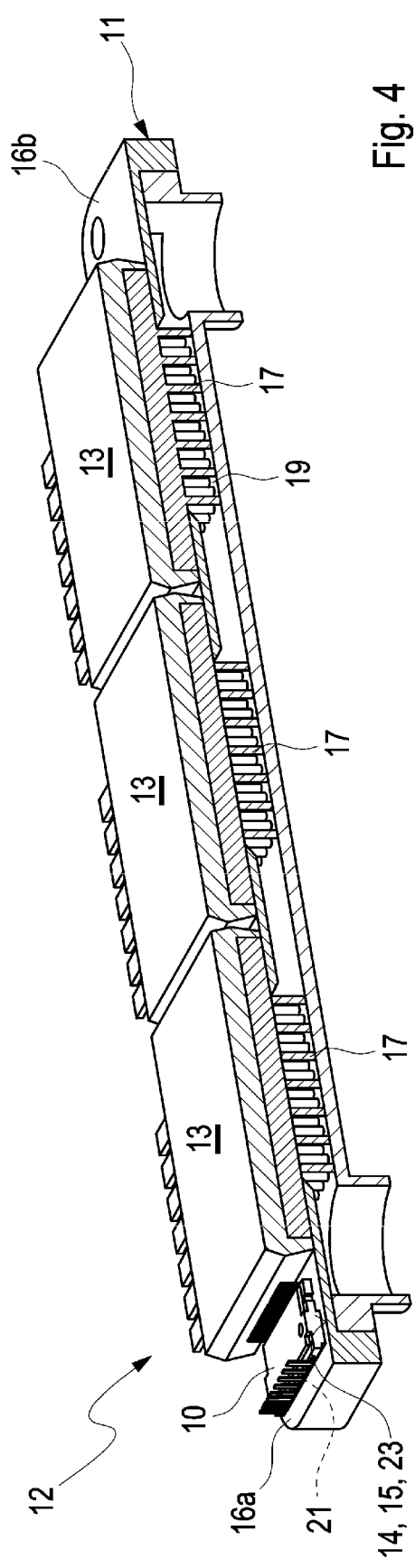
FIG. 4 shows a perspective side view of the embodiment shown in FIG. 3 of the traction inverter with a molded power module arranged on the cooling connection.

FIG. 4 shows a perspective side view of the embodiment of the traction inverter 12 (shown in FIG. 3) having a molded power module 10 that is arranged on the cooling connection 15. The main cooler 11 is configured to receive conventional power modules 13 and to heat them via the PinFin structures 17. The main cooler 11 has the bearing surface 14 on which the conventional power modules 13 are arranged. The main cooler 11 also has the extension 23 of the bearing surface 14. The bearing surface 14 has the first end 16a and the second end 16b. The cooling connection 15 is formed on the extension 23 of the bearing surface 14 which, in the present embodiment, is formed at the first end 16a of the bearing surface 14. In the present embodiment, the cooling connection is formed as a plane surface and is configured to receive a molded power module (not shown).

In the present embodiment, the molded power module 10 is arranged on the cooling connection 15. The contact region 21 of the molded power module 10 rests on the cooling connection 15. The molded power module 10 comprises the integrated exciter circuit (not shown) and the integrated current sensor system. The heat of the exciter circuit and of the current sensor system are dissipated to the cooling connection 15 of the main cooler 11 via the contact region 21 via a thermal connection (not shown). The cooling connection 15 is designed as a heat sink which delivers the heat to the water-cooled main cooler 11.

German patent application no. 10 2019 125 733.6, to which this application claims priority, is hereby incorporated herein by reference in its entirety.

Aspects and features of the various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled.

The invention claimed is:

1. A power module for electric drives, comprising: at least one exciter circuit having at least one power semiconductor, wherein the power module is molded and the exciter circuit having the at least one power semiconductor is integrated in the molded power module, wherein the exciter circuit is a DC'DC converter, wherein the power module comprises a current sensor system which is integrated in the molded power module, and wherein the current sensor system comprises at least two measuring shunts, at least one filter, an integrator stage, a delta-sigma converter modulator, at least one galvanic separation and at least one receiver interface for an interface to a microcontroller.

2. The power module according to claim 1, wherein the power module has a contact region which is configured and designed to be able to be placed on a main cooler of a traction inverter.

3. The power module according to claim 2, wherein the exciter circuit integrated in the power module is arranged in the molded power module in such a way that heat of the exciter circuit can be conducted to the contact region and can be discharged or dissipated via the contact region.

4. A traction inverter, comprising: a water-cooled main cooler, wherein the main cooler comprises a bearing surface which is configured to receive power modules; and at least one molded power module including at least one exciter circuit having at least one power semiconductor, wherein the power module is molded and the exciter circuit having the at least one power semiconductor is integrated in the molded power module, wherein the exciter circuit is a DC: DC converter; wherein the power module comprises a current sensor system which is integrated in the molded power module, and wherein the current sensor system comprises at least two measuring shunts, at least one filter, an integrator stage, a delta-sigma converter modulator, at least one galvanic separation and at least one receiver interface for an interface to a microcontroller, wherein the main cooler forms a cooling connection which is configured to receive the at least one molded power module on the main cooler.

5. The traction inverter according to claim 4, wherein the cooling connection is designed as an extension of the bearing surface of the main cooler and is configured to receive the at least one molded power module.

6. The traction inverter according to claim 4, wherein the cooling connection is designed as a plane surface and configured to at least partially receive the at least one molded power module.

7. The traction inverter according to claim 4, wherein the cooling connection is configured to absorb or dissipate heat which is dissipated by the at least one molded power module.

8. The traction inverter according to claim 4, wherein the main cooler comprises at least two cooling connections, Wherein a first cooling connection is formed at a first end of the bearing surface and a second cooling connection is formed at a second end of the bearing surface which is arranged opposite the first end.

* * * * *

UNITED STATES PATENT AND TRADEMARK OFFICE
CERTIFICATE OF CORRECTION

| | | |
|---|---|---|
| PATENT NO. | : 11,659,698 B2 | Page 1 of 1 |
| APPLICATION NO. | : 17/031673 | |
| DATED | : May 23, 2023 | |
| INVENTOR(S) | : Daniel Ruppert | |

It is certified that error appears in the above-identified patent and that said Letters Patent is hereby corrected as shown below:

In the Claims

Column 6, Claim 1, Line 64:
"DC'DC" should read: --DC/DC--.

Column 6, Claim 4, Line 20:
"DC: DC" should read: --DC/DC--.

Column 8, Claim 8, Lines 19-20:
"connections, Wherein a first cooling" should read: --connections, wherein a first cooling--.

Signed and Sealed this
Fourth Day of February, 2025

Coke Morgan Stewart
*Acting Director of the United States Patent and Trademark Office*